United States Patent [19]

Haluska et al.

[11] Patent Number: 4,808,653
[45] Date of Patent: Feb. 28, 1989

[54] COATING COMPOSITION CONTAINING HYDROGEN SILSESQUIOXANE RESIN AND OTHER METAL OXIDE PRECURSORS

[75] Inventors: Loren A. Haluska; Keith W. Michael, both of Midland; Leo Tarhay, Sanford, all of Mich.

[73] Assignee: Dow Corning Corporation, Midland, Mich.

[21] Appl. No.: 166,587

[22] Filed: Mar. 10, 1988

Related U.S. Application Data

[62] Division of Ser. No. 938,677, Dec. 4, 1986, Pat. No. 4,753,855.

[51] Int. Cl.[4] ............................................. C08K 5/04
[52] U.S. Cl. ............................... 524/398; 106/287.1; 106/287.14; 524/394; 524/399; 423/325
[58] Field of Search ..................... 106/287.1, 287.14; 524/394, 398, 399; 423/325

[56] References Cited

U.S. PATENT DOCUMENTS 4,753,855 6/1988 Haluska et al. .................... 428/702
4,756,977 7/1988 Haluska et al. .................... 428/704

Primary Examiner—Melvyn I. Marquis
Attorney, Agent, or Firm—James E. Bittell

[57] ABSTRACT

This invention relates to materials produced by diluting in a solvent a preceramic mixture of a hydrogen silsesquioxane resin and a metal oxide precursor selected from the group consisting of an aluminum alkoxide, a titanium alkoxide, and a zirconium alkoxide. The preceramic mixture solvent solution is applied to a substrate and ceramified by heating. One or more ceramic coatings containing silicon carbon, silicon nitrogen, or silicon carbon nitrogen can be applied over the ceramified $SiO_2$/metal oxide coating. A CVD or PECVD top coating can be applied for further protection. The invention is particularly useful for coating electronic devices.

11 Claims, No Drawings

COATING COMPOSITION CONTAINING HYDROGEN SILSESQUIOXANE RESIN AND OTHER METAL OXIDE PRECURSORS

This is a divisional of application Ser. No. 938,677 filed on Dec. 4, 1986, now U.S. Pat. No. 4,753,855.

BACKGROUND OF THE INVENTION

Electronic devices, to be serviceable under a wide variety of environmental conditions, must be able to withstand moisture, heat, and abrasion resistance, among other stresses. A significant amount of work has been reported directed toward the preparation of coatings for electronic devices which can increase the reliability of the devices. None of the conventional coatings available today, including ceramic and metal packaging, can perform well enough by itself to protect an electronic device against all environmental stresses.

A common cause of failure of electronic devices is microcracks or voids in the surface passivation of the semiconductor chip allowing the introduction of impurities. Thus a need exists for a method which will overcome the formation of microcracks, voids or pinholes in inorganic coatings of electronic devices.

Passivating coatings on electronic devices can provide barriers against ionic impurities, such as chloride ion (Cl−) and sodium ion (Na+), which can enter an electronic device and disrupt the transmission of electronic signals. The passivating coating can also be applied to electronic devices to provide some protection against moisture and volatile organic chemicals.

Amorphous silicon (hereinafter a-Si) films have been the subject of intense research for various applications in electronic industries, however, the use of a-Si films for environmental or hermetic protection of electronic devices is unknown. A number of possible processes have been previously disclosed for forming a-Si films. For instance, for producing films of amorphous silicon, the following deposition processes have been used: chemical vapor deposition (CVD), plasma enhanced CVD, reactive sputtering, ion plating and photo-CVD, etc. Generally, the plasma enhanced CVD process is industrialized and widely used for depositing a-Si films.

Known to those skilled in the art is the utility of substrate planarization as an interlayer within the body of an electronic device and between the metallization layers. Gupta and Chin (Microelectronics Processing, Chapter 22, "Characteristics of Spin-On Glass Films as a Planarizing Dielectric", pp. 349–65, American Chemical Society, 1986) have shown multilevel interconnect systems with isolation of metallization levels by conventional interlevel dielectric insulator layers of doped or undoped $SiO_2$ glass films. However, CVD dielectric films provide only at best a conformal coverage of substrate features which is not conducive to continuous and uniform step coverage by an overlying metallization layer. The poor step coverage results in discontinuous and thin spots in the conductor lines causing degradation of metallization yields as well as device reliability problems. Spin-on glass films have been utilized to provide interlayer isolation between the metallization layers, the top layer of which is later patterned by lithographic techniques. Topcoat planarization on the surface of an electronic device as opposed to planarizing interlevel dielectric layers, however, is unknown.

Under the teachings of the prior art, a single material most often will not suffice to meet the ever increasing demands of specialty coating applications, such as those found in the electronics industry. Several coating properties such as microhardness, moisture resistance, ion barrier, adhesion, ductility, tensile strength, thermal expansion coefficients, etc., need to be provided by successive layers of different coatings.

Silicon and nitrogen-containing preceramic polymers, such as silazanes have been disclosed in various patents, including U.S. Pat. No. 4,404,153, issued September 13, 1983 to Gaul, wherein there is disclosed a process for preparing $R'_3SiNH$- containing silazane polymers by contacting and reacting chlorine-containing disilanes with $(R'_3Si)_2NH$ where $R'$ is vinyl, hydrogen, an alkyl radical of 1 to 3 carbon atoms or the phenyl group. Gaul also teaches therein the use of the preceramic silazane polymers to produce silicon-carbon-nitrogen-containing ceramic materials.

Gaul in U.S. Pat. No. 4,312,970, issued January 26, 1982, obtained ceramic materials by the pyrolysis of preceramic silazane polymers, which polymers were prepared by reacting organochlorosilanes and disilazanes.

Gaul in U.S. Pat. No. 4,340,619, issued July 20, 1982, obtained ceramic materials by the pyrolysis of preceramic silazane polymers, which polymers were prepared by reacting chlorine-containing disilanes and disilazanes.

Cannady in U.S. Pat. No. 4,540,803, issued September 10, 1985, obtained ceramic materials by the pyrolysis of preceramic silazane polymers, which polymers were prepared by reacting trichlorosilane and disilazanes.

Frye and Collins teach on U.S. Pat. No. 3,615,272, issued October 26, 1971, and also in Frye, et al., J. Am. Chem. Soc., 92, p.5586, 1970, the formation of hydrogen silsesquioxane resin.

Dietz et al., United States Pat. No. Number 3,859,126, issued January 7, 1975, teaches the formation of a composition comprising PbO, $B_2O_3$, and ZnO, with optional various oxides including $SiO_2$.

Rust et al., United States Pat. No. 3,061,587, issued Oct. 30, 1963, teaches a process for forming ordered organo silicon-aluminum oxide copolymers by reacting dialkyl diacyloxsilane or dialkyl dialkoxysilane, with trialkylsiloxy dialkoxy aluminum.

The instant invention relates to the enhancement of the protection of electronic devices by the low temperature formation of thin multilayer ceramic or ceramic-like coatings on the surface of the device. What has been discovered is a method of forming coatings from hydrogen silsesquioxane resin and one or more metal oxides, which are subsequently coated with one or more silicon, or silicon and nitrogen, or silicon and carbon and nitrogen-containing, ceramic or ceramic-like coatings.

SUMMARY OF THE INVENTION

The instant invention relates to the low temperature formation of monolayer and multilayer protective coatings for the protection of electronic devices. The monolayer coatings of the present invention consist of a coating prepared by contacting hydrogen silsesquioxane resin $(HSiO_{3/2})_n$ with zirconium, aluminum, and/or titanium alkoxides to produce a homogeneous preceramic polymer material. The dual-layer coatings of the present invention consist of (1) a coating prepared by contacting hydrogen silsesquioxane resin $(HSiO_{3/2})_n$ with zirconium, aluminum, and/or titanium alkoxides and (2) a topcoat of silicon-containing material, or silicon nitrogen-containing material, or silicon carbon-containing material, derived by heating a silane, halosilane, haoldisilane, halopolysilane or mixture thereof to provide protection. The first layer is a $SiO_2/TiO_2$, or $SiO_2/ZrO_2$, or $SiO_2/TiO_2/ZrO_2$, or $SiO_2/Al_2O_3$, or $SiO_2/TiO$ planarizing and passivating coating that is applied by known techniques, including flow coating, spin coating, dip coating and spray coating of an electronic device and then ceramifying. The second layer of the dual-layer coatings of the instant invention is a protective barrier coating of silicon-containing material derived from the CVD or plasma enhanced CVD of silanes, alkylsilanes, halosilanes, halodisilanes, silazanes, or mixtures of alkanes, silanes, and ammonia.

The instant invention also relates to the low temperature formation of a three layer coating system for electronic devices wherein the first layer is a $SiO_2/TiO_2$, or $SiO_2/ZrO_2$, or $SiO_2/TiO_2ZrO_2$, or $SiO_2/Al_2O_3SiO_2/TiO_2/ZrO_2/Al_2O_3$ coating. The second layer, used for passivation, is a ceramic or ceramic-like coating obtained by the ceramification of a preceramic silicon nitrogen-containing polymer coating, or is a silicon nitrogen-containing, silicon carbon nitrogen-containing, or silicon carbon-containing layer deposited by thermal, UV, CVD, plasma enhanced CVD, or laser techniques. The third layer in the three layer coatings of the present invention is a top coating of (a) silicon-containing material applied by CVD, plasma enhanced CVD, or metal assisted CVD of a halosilane, halodisilane, halopolysilane, or mixtures thereof, or (b) silicon carbon-containing material, applied by CVD or plasma enhanced CVD of a halosilane, halodisilane, halopolysilane, or mixtures thereof, and an alkane, or (c) silicon nitrogen-containing material applied by CVD or plasma enhanced CVD of a silane, halosilane, halodisilane, halopolysilane, or mixtures thereof, and ammonia, or (d) silicon carbon nitrogen-containing material applied by CVD or plasma enhanced CVD or hexamethyldisilazane or CVD or plasma enhanced CVD of mixtures of a silane, an alkylsilane, an alkane and ammonia.

DETAILED DESCRIPTION OF THE INVENTION

The instant invention relates to the discovery that hydrogen silsesquioxane resin $(HSiO_{3/2})_n$ can be contacted with zirconium, aluminum or titanium alkoxides to prepare novel preceramic polymers that can be converted at low temperatures to ceramic or ceramic-like materials useful as planarizing coatings for irregular surfaces of electronic devices. In the instant invention, by "alkoxide" is meant any alkoxy, acyloxy, dialkoxy, trialkoxy, or tetraalkoxy organic group which is bonded to a metal and which can be hydrolyzed and subsequently pyrolyzed under the ceramification conditions stated herein to produce a metal oxide. By the instant invention, ceramic or ceramic-like planarizing coating compositions such as $SiO_2/ZrO_2$, $SiO_2/TiO_2$, $SiO_2/TiO_2/ZrO_2$, and $SiO_2/Al_2O_3$ These metal oxide ceramic or ceramic-like coatings minimize mechanical stresses due to the irregular topography of an integrated circuit or electronic device and also help prevent microcracking of subsequent multilayer coatings under thermal cycling conditions.

In the instant invention, by "ceramic-like" is meant those pyrolyzed silicon-nitrogen containing materials which are not fully free of residual carbon and/or hydrogen but which are otherwise ceramic-like in character. By "electronic device" in the instant invention is meant devices including, but not limited to, electronic devices, silicon based devices, gallium arsenide devices, focal plane arrays, opto-electronic devices, photovoltaic cells and optical devices.

The preceramic hydrogen silsesquioxane resin material can be prepared by the method of Frye, et al. United States Pat. No. 3,615,272, issued Oct. 26, 1971.

The invention further relates to the discovery that these ceramics can be used as coatings for multilayer electronic devices as well as other integrated circuits. The coatings of the instant invention are also useful for functional purposes not related to protection of the substrate, such as, dielectric layers, doped dielectric layers to produce transistor-like devices, pigment loaded binder systems containing silicon to produce capacitors and capacitor-like devices, multilayer devices, 3-D devices, silicon-on-insulator (SOI) devices, super lattice devices and the like.

The instant invention also relates to the formation of silicon- and nitrogen-containing passivating coatings and silicon-containing top coatings for ceramic or ceramic-like coated electronic devices whereby the top coating is prepared by CVD, plasma enhanced CVD or metal catalyzed CVD techniques.

The monolayer coatings of the present invention are produced by coating a substrate with a planarizing coating by means of diluting with a solvent a preceramic mixture of hydrogen silsesquioxane resin and a metal oxide precursor selected from the group consisting of an aluminum alkoxide, a titanium alkoxide, and a zirconium alkoxide, and coating a substrate with a solvent diluted preceramic polymer resin solution, drying the diluted preceramic polymer resin solution so as to evaporate the solvent and thereby deposit a preceramic coating on the substrate, ceramifying the polymer resin to silicon dioxide and metal oxide by heating the coated substrate to produce a monolayer ceramic coating on the substrate.

The coatings produced by the instant invention exhibit strong adhesion to many substrates including, but not limited to, electronic devices, and are abrasion and moisture resistant. The choice of substrates and devices to be coated by the instant invention is limited only by the need for thermal and chemical stability of the substrate at the lower decomposition temperature in the atmosphere of the decomposition vessel.

In addition, the instant invention relates to a method of forming a multilayer, ceramic or ceramic-like, coating which method comprises (A) coating an electronic device with a planarizing coating by means of diluting with a solvent a preceramic mixture of hydrogen silsesquioxane resin and a metal oxide precursor selected from the group consisting of an aluminum alkoxide, titanium alkoxide, and zirconium alkoxide, coating an electronic device with said diluted preceramic polymer resin solution, drying the diluted preceramic polymer resin solution so as to evaporate the solvent and thereby deposit a homogeneous preceramic coating on the electronic device, ceramifying the polymer resin to silicon dioxide and metal oxide by heating the coated device to produce the ceramic coating, and (B) applying to the ceramic coated device a silicon-containing coating by means of decomposing in a reaction chamber a silane, halosilane, halodisilane or mixture thereof in the vapor phase, at a temperature between 200 and 1000 degrees Centigrade, in the presence of the ceramic coated device, whereby an electronic device containing a multilayer, ceramic, coating thereon is obtained. The method for coating the electronic device with the preceramic solvent solution can be, but is not limited to, flow coating, spin coating, spray or dip coating techniques.

The instant invention further relates to a method of forming a multilayer, ceramic or ceramic-like, protective coating comprising (A) coating an electronic device with a coating by means of diluting to low solids in a solvent a hydrogen silsesquioxane preceramic polymer resin, which has been contacted with tetra n-propoxy zirconium, coating an electronic device with said diluted preceramic polymer resin solution, drying the diluted preceramic polymer resin solution so as to evaporate the solvent and thereby deposit a preceramic coating on the electronic device, ceramifying the polymer resin to silicon dioxide and zirconium dioxide by heating the coated device to produce a ceramic or ceramic-like coating, and (B) applying to the ceramic or ceramic-like coating on the electronic device a silicon-containing coating by means of decomposing in a reaction chamber a silane, halosilane, halodisilane or mixture of halosilanes in the vapor phase, at a temperature between 200 and 400 degrees Centigrade, in the presence of the coated device, whereby an electronic device containing a multilayer, ceramic or ceramic-like, protective coating thereon is obtained.

The instant invention further relates to a method of forming a multilayer, ceramic or ceramic-like coating which method comprises (A) coating an electronic device with a coating by means of diluting to low solids in a solvent a hydrogen silsesquioxane preceramic polymer resin, which has been contacted with tetra isobutoxy titanium, coating an electronic device with said diluted preceramic polymer resin solution, drying the diluted preceramic polymer resin solution so as to evaporate the solvent and thereby deposit a preceramic coating on the electronic device, ceramifying the polymer resin to silicon dioxide and titanium dioxide by heating the coated device to produce a ceramic or ceramic-like coating, and (B) applying to the coated device a silicon-containing coating by means of decomposing in a reaction chamber a silane, halosilane, halodisilane or mixture of halosilanes in the vapor phase, at a temperature between 200 and 400 degrees Centigrade, in the presence of the coated device, whereby an electronic device containing a multilayer, ceramic or ceramic-like coating thereon is obtained.

The instant invention further relates to a method of forming a multilayer, ceramic or ceramic-like coating which method comprises (A) coating an electronic device with a coating by means of diluting to low solids in a solvent a hydrogen silsesquioxane preceramic polymer resin, which has been contacted with an aluminum alkoxide, coating an electronic device with said diluted preceramic polymer resin solution, drying the diluted preceramic polymer resin solution so as to evaporate the solvent and thereby deposit a preceramic coating on the electronic device, ceramifying the polymer resin to silicon dioxide and aluminum oxide by heating the coated device to produce a ceramic or ceramic-like coating, and (B) applying to the ceramic or ceramic-like coating on the electronic device a silicon-containing coating by means of decomposing in a reaction chamber a silane, halosilane, halodisilane or mixture of halosilanes in the vapor phase, at a temperature between 200 and 400 degrees Centigrade, the presence of the coated device, whereby an electronic device containing a multilayer, ceramic or ceramic-like protective coating thereon is obtained.

The instant invention further relates to a method of forming a multilayer, ceramic or ceramic-like coating which method comprises (A) coating an electronic device with a coating by means of diluting with a solvent a preceramic mixture of hydrogen silsesquioxane resin and a metal oxide precursor selected from the group consisting of an aluminum alkoxide, titanium alkoxide, and zirconium alkoxide, coating an electronic device with said diluted preceramic mixture solution, drying the diluted preceramic polymer mixture solution so as to evaporate the solvent and thereby deposit a preceramic coating on the electronic device, ceramifying the preceramic coating to silicon dioxide and metal oxide by heating the coated device to produce a ceramic or ceramic-like coating, and (B) applying to the coated device a passivating coating which comprises a silicon nitrogen-containing material by means of diluting to low solids in a solvent a preceramic silicon nitrogen-containing polymer, coating the ceramic coated device with the diluted preceramic silicon nitrogen-containing polymer solution, drying the diluted preceramic silicon nitrogen-containing polymer solution so as to evaporate the solvent and thereby deposit a preceramic silicon nitrogen-containing coating on the coated electronic device, heating the coated device in an inert or ammonia-containing atmosphere to produce a ceramic or ceramic-like silicon nitrogen-containing coating, and (C) applying to the coated device a silicon-containing coating by means of decomposing in a reaction chamber a silane, halosilane, halodisilane, halopolysilane or mixture thereof in the vapor phase, at a temperature between 200 and 900 degrees Centigrade, in the presence of the coated device, whereby an electronic device containing a multilayer, ceramic or ceramic-like coating thereon is obtained.

The ceramification of the planarizing and passivating coatings utilized in the multilayer coatings of the instant invention can be achieved at temperatures between 200 and 1000 degrees Centigrade and preferably at temperatures between 200 and 400 degrees Centigrade.

In the instant invention, a preceramic polymer containing hydrogen silsesquioxane resin, $(HSiO_{3/2})_n$, which can be prepared by the method of Frye, et al., U.S. Pat. No. 3,615,272, is diluted after the incorporation of, for example, tetra n-propoxy zirconium, $Zr(OCH_2CH_2CH_3)_4$, or tetra isobutoxy titanium, $Ti(OCH_2CH(CH_3)_2)_4$, to low solids (eg., 0.1 to 10 weight %) in a solvent such as toluene, methyl ethyl ketone, or n-heptane. The diluted preceramic polymer solvent solution is then coated onto an electronic device and the solvent allowed to evaporate by drying. The method of coating the diluted preceramic polymer solution onto the electronic device can be, but is not limited to, spin coating, dip coating, spray coating, or flow coating. By this means is deposited a homogeneous preceramic coating which is ceramified by heating the coated device for approximately twenty hours at 200 degrees Centigrade or for one hour at 400 degrees Centigrade. This represents a significant processing temperature reduction over that of the prior art. Thin ceramic or ceramic-like planarizing coatings of less than 2 microns (or approximately 5000 A) are thus produced on the devices. The planarizing coatings thus produced can then be coated with a passivating silicon nitrogen-containing coating of the present invention or with a CVD or PECVD applied silicon-containing coating, silicon carbon-containing coating, silicon nitrogen-containing coating, silicon carbon nitrogen-containing coating, or a combination of these coatings.

Sample formulations of the planarizing coatings of the instant invention include, but are not limited to, those depicted in Table I.

TABLE I

Composition of Some Planarizing Coatings of the Instant Invention

| Sample No. | $SiO_2$ wt. % | $ZrO_2$ wt. % | $TiO_2$ wt. % | $Al_2O_3$ wt. % |
|---|---|---|---|---|
| 1 | 90 | 10 | | |
| 2 | 100 | | | |
| 3 | 90 | | 10 | |
| 4 | 74.7 | | | 25.3 |
| 5 | 80 | 10 | 10 | |
| 6 | 70 | 10 | 10 | 10 |
| 7 | 80 | | 20 | |
| 8 | 70 | | 30 | |
| 9 | 80 | 20 | | |
| 10 | 70 | 30 | | |
| 11 | 70 | | | 30 | where wt % is weight per cent; $ZrO_2$ is zirconium dioxide produced from zirconium alkoxide; $TiO_2$ is titanium dioxide produced from titanium alkoxide; $Al_2O_3$ is aluminum oxide produced from aluminum pentanedionate.

While Table I indicates a metal alkoxide composition in the coatings of 10 weight per cent, the concentration range of metal oxide may vary from 0.1 weight per cent metal alkoxide up to approximately 30 weight percent. By varying the ratio of hydrogen silsesquioxane resin to metal alkoxide (and thus to the resulting metal oxide) specific formulations with desired coefficients of thermal expansion (CTE) can be designed. It is desirable in coating electronic devices that the CTE of the coating allow for sufficient thermal expansion so as to minimize the formation of microcracks upon exposure of the coated device to temperature variations. Table II shows the CTE values for several common ceramic materials used in coating electronic devices and also the CTE values of ceramic planarizing coatings of the instant invention.

TABLE II

Coefficients of Thermal Expansion

| Metal Oxide | CTE |
|---|---|
| Titanium dioxide, $TiO_2$ | 9.4 |
| Aluminum oxide, $Al_2O_3$ | 7.2–8.6 |
| Zirconium dioxide, $ZrO_2$ | 7.6–10.5 |
| Silica, $SiO_2$ | 0.5 |
| Silicon, Si | 2.14 |
| 80% $SiO_2$/20% $TiO_2$ | 2.28 |
| 75% $SiO_2$/25% $TiO_2$ | 2.63 |
| 90% $SiO_2$/10% $TiO_2$ | 1.39 |
| 90% $SiO_2$/10% $ZrO_2$ | 1.21 |
| 70% $SiO_2$/30% $TiO_2$ | 3.17 |
| 70% $SiO_2$/30% $ZrO_2$ | 2.63 |
| 80% $SiO_2$/20% $ZrO_2$ | 1.92 |
| 75% $SiO_2$/25% $Al_2O_3$ | 2.18 |
| 75% $SiO_2$/25% $ZrO_2$ | 2.28 |

The source for the reference data appearing above is "Ceramic Source", American Chemical Society, vol. 1., 1985, p. 350-1. The CTE values for the compositions of the instant invention are calculated.

The chemical compounds in which the aluminum, zirconium, and titanium are operative in the present invention are not limited to the oxide or dioxide forms listed above but include any and all forms and mixtures of the metals which can be blended with the hydrogen silsesquioxane resin and ceramified to produce the mixed oxide planarizing coating system of the instant invention.

The second and passivating silicon nitrogen-containing layer of the composite coatings in the instant invention provides resistance against ionic impurities. Preceramic silicon nitrogen-containing polymers suitable for use in this present invention are well known in the art, including, but not limited to, silazanes, disilazanes, polysilazanes, cyclic silazanes and other silicon nitrogen-containing materials. The preceramic silicon nitrogen-containing polymers suitable for use in this invention must be capable of being converted to a ceramic or ceramic-like material at elevated temperatures. Mixtures of preceramic silazane polymers and/or other silicon- and nitrogen-containing materials may also be used in this invention. Examples of preceramic silazane polymers or polysilazanes suitable for use in this invention include polysilazanes as described by Gaul in U.S. Pat. Nos. 4,312,970 (issued Jan. 26, 1982), 4,340,619 (issued July 20, 1982), 4,395,460 (issued July 26, 1983), and 4,404,153 (issued Sept. 13, 1983), all of which are hereby incorporated by reference. Suitable polysilazanes also include those described by Haluska in U.S. Pat. No. 4,482,689 (issued November 13, 1984) and by Seyferth et al. in U.S. Pat. No. 4,397,828 (issued Aug. 9, 1983), and Seyferth et al. in U.S. Pat. No. 4,482,669 (issued Nov. 13, 1984) which are hereby incorporated by reference. Other polysilazanes suitable for use in this invention are disclosed by Cannady in U.S. Pat. No. 4,540,803 (issued Sept. 10, 1985), 4,535,007 (issued Aug. 13, 1985), and 4,543,344 (issued September 24, 1985), and by Baney et al. in U.S. patent application Ser. No. 652,939, filed September 21, 1984, now abandoned, all of which are hereby incorporated by reference. Also suitable for use in this invention are dihydridosilazane polymers prepared by the reaction of $H_2SiX_2$, where X=a halogen atom, and $NH_3$. These $(H_2SiNH)_n$ polymers are well known in the art, but have not been used for the protection of electronic devices. (See, for example, Seyferth, U.S. Pat. No. 4,397,828, issued Aug. 9, 1983).

Also to be included as preceramic silicon nitrogen-containing polymer materials useful within the scope of the present invention are the novel preceramic polymers derived from cyclic silazanes and halogenated disilanes, and also the novel preceramic polymers derived from cyclic silazanes and halosilanes. These materials are disclosed and claimed in patent applications of Ser. Nos. 926,145, filed 11/3/86, now U.S. Pat. No. 4,745,205, titled "Novel Preceramic Polymers Derived From Cyclic Silazanes And Halogenated Disilanes And A Method For Their Preparation", and 926,607, filed on 11/4/86, now U.S. Pat. No. 4,742,143, titled "Novel Preceramic Polymers Derived From Cyclic Silazanes And Halosilanes And A Method For Their Preparation", respectively, filed in the name of Loren A. Haluska and hereby incorporated by reference. The above-described novel preceramic silicon nitrogen-containing polymers derived from cyclic silazanes and halosilanes and/or halogenated disilanes are also useful for the protection of any substrate able to withstand the temperatures necessary for ceramification of the preceramic polymers. Still other silicon- and nitrogen-containing materials may be suitable for use in the present invention.

A preferred temperature range for ceramifying or partially ceramifying the silicon nitrogen-containing preceramic polymer is from 200 to 400 degrees Centigrade. A more preferred temperature range for ceramifying the silicon nitrogen-containing preceramic polymer is from 300 to 400 degrees Centigrade. However, the method of applying the heat for the ceramification or partial ceramification of the silicon nitrogen-containing coating is not limited to conventional thermal methods. The silicon nitrogen-containing polymer coatings useful as planarizing and passivating coatings in the instant invention can also be cured by other radiation means, such as, for example, exposure to a laser beam. However, the present invention is not limited to ceramification temperatures below 400° Centigrade. Ceramification techniques utilizing temperatures up to and including at least 1000° Centigrade will be obvious to those skilled in the art, and are useful in the present invention where the substrate can withstand such temperatures.

By "cure" in the present invention is meant coreaction and ceramification or partial ceramification of the starting material by heating to such an extent that a solid polymeric ceramic or ceramic-like coating material is produced.

Alternatively, in the three layer coating of the instant invention, the second and passivating coating can be selected from the group consisting of silicon nitrogen-containing material, silicon carbon nitrogen-containing material, and silicon carbon-containing material. The silicon nitrogen-containing material is deposited by the CVD or plasma enhanced CVD of the reaction product formed by reacting silane, halosilanes, halopolysilanes, or halodisilanes and ammonia. The silicon carbon-containing material is deposited by the CVD or plasma enhanced CVD of the reaction product formed by reacting silane, halosilanes, halopolysilanes, or halodisilanes and an alkane of one to six carbon atoms or alkylsilane. The silicon carbon nitrogen-containing material is deposited by the CVD or PECVD of hexamethyldisilazane or the CVD or PECVD of mixtures of a silane, an alkylsilane, an alkane of one to six carbon atoms, and ammonia.

The second and passivating coating of the multilayer coatings of the instant invention can be produced by applying to the planarizing coating a passivating ceramic or ceramic-like coating selected from the group consisting of (i) a silicon nitrogen-containing coating, (ii) a silicon carbon-containing coating, and (iii) a silicon carbon nitrogen-containing coating, wherein the silicon nitrogen-containing coating is applied onto the ceramic or ceramic-like coated electronic device by a means selected from the group consisting of (a) chemical vapor deposition of a silane, halosilane, halodisilane, halopolysilane or mixtures thereof in the presence of ammonia, (b) plasma enhanced chemical vapor deposition of a silane, halosilane, halodisilane, halopolysilane or mixtures thereof in the presence of ammonia, (c) ceramification of a silicon and nitrogen-containing preceramic polymer; and wherein the silicon carbon nitrogen-containing coating is applied onto the ceramic or ceramic-like coated electronic device by a means selected from the group consisting of (1) chemical vapor deposition of hexamethyldisilazane, (2) plasma enhanced chemical vapor deposition of hexamethyldisilazane, (3) chemical vapor deposition of a silane, alkylsilane, halosilane, halodisilane, halopolysilane or mixture thereof in the presence of an alkane of one to six carbon atoms or an alkylsilane and further in the presence of ammonia, and (4) plasma enhanced chemical vapor deposition of a silane, alkylsilane, halosilane, halodisilane, halopolysilane or mixture thereof in the presence of an alkane of one to six carbon atoms or an alkylsilane and further in the presence of ammonia; and wherein the silicon carbon-containing coating is deposited by a means selected from the group consisting of (i) chemical vapor deposition of a silane, alkylsilane, halosilane, halodisilane, halopolysilane or mixtures thereof in the presence of an alkane of one to six carbon atoms or an alkylsilane and (ii) plasma enhanced chemical vapor deposition of a silane, alkylsilane, halosilane, halodisilane, halopolysilane or mixtures thereof in the presence of an alkane of one to six carbon atoms or an alkylsilane, to produce the passivating ceramic or ceramic-like coating.

The preceramic silazane or other silicon nitrogen-containing polymer solvent solution is coated (by any method discussed above) onto the electronic device previously coated with the ceramified $HSiO_{3/2}$/metal alkoxide coating, such as, $HSiO_{3/2}$/Zr($OCH_2CH_2CH_3$)$_4$ resin, or $HSiO_{3/2}$/Zr($OCH_2CH_2CH_3$)$_4$/Ti($OCH_2CH_2CH_2CH_3$)$_4$ resin and the solvent allowed to evaporate by drying. By this means is deposited a preceramic polymer coating which is ceramified by heating the coated device for approximately one hour at temperatures up to 400 degrees Centigrade under argon. Thin ceramic passivating coatings of less than 2 microns (or approximately 5000 Angstroms) are thus produced on the devices.

The third layer of the multilayer coatings of the instant invention can be produced by applying to the passivating ceramic or ceramic-like coating a silicon-containing coating selected from the group consisting of (i) a silicon coating, (ii) a silicon carbon-containing coating, (iii) a silicon nitrogen-containing coating, and (iv) a silicon carbon nitrogen-containing coating, wherein the silicon coating is applied onto the passivating coating by a means selected from the group consisting of (a) chemical vapor deposition of a silane, halosilane, halodisilane, halopolysilane or mixtures thereof, (b) plasma enhanced chemical vapor deposition of a silane, halosilane, halodisilane, halopolysilane or mixtures thereof, or (c) metal assisted chemical vapor deposition of a silane, halosilane, halodisilane, halopolysilane or mixtures thereof, and wherein the silicon carbon-containing coating is applied by a means selected from the group consisting of (1) chemical vapor deposition of a silane, halosilane, halodisilane, halopolysilane or mixtures thereof in the presence of an alkane of one to six carbon atoms or an alkylsilane, (2) plasma enhanced chemical vapor deposition of a silane, alkylsilane, halosilane, halodisilane, halopolysilane or mixtures thereof in the presence of an alkane of one to six carbon atoms or an alkylsilane; and wherein the silicon nitrogen-containing coating is deposited by a means selected from the group consisting of (A) chemical vapor deposition of a silane, halosilane, halodisilane, halopolysilane or mixtures thereof in the presence of ammonia, (B) plasma enhanced chemical vapor deposition of a silane, halosilane, halodisilane, halopolysilane or mixtures thereof in the presence of ammonia, and (C) ceramification of a silicon and nitrogen-containing preceramic polymer, and wherein the silicon carbon nitrogen-containing coating is deposited by a means selected from the group consisting of (i) chemical vapor deposition of hexamethyldisilazane, (ii) plasma enhanced chemical vapor deposition of hexamethyldisilazane, (iii) chemical vapor deposition of a silane, alkylsilane, halosilane, halodisilane, halopolysilane or mixture thereof in the presence of an alkane of one to six carbon atoms or an alkylsilane and further in the presence of ammonia, and (iv) plasma enhanced chemical vapor deposition of a silane, alkylsilane, halosilane, halodisilane, halopolysilane or mixture thereof in the presence of an alkane of one to six carbon atoms or an alkylsilane and further in the presence of ammonia; to produce the silicon-containing coating on the electronic device. The silicon-containing protective third layer or topcoat of the composite coatings of the present invention can be obtained at relatively low reaction temperature by the metal-assisted CVD process claimed in the parallel U.S. patent application, Ser. No. 835,029, filed Feb. 2, 1986, now U.S. Pat. No. 4,675,337, in the name of Sudarsanan Varaprath and entitled "Silicon-containing Coatings and a Method for Their Preparation", or by conventional non-metal assisted CVD and plasma enhanced CVD techniques. The high temperature conditions of the conventional CVD technique normally limit the type of substrate materials which can be coated. Thus, electronic devices which cannot be heated over 400 degrees Centigrade without damage cannot be coated by conventional CVD techniques. The choice of substrates and devices to be coated by the instant invention is limited only by the need for thermal and chemical stability of the substrate at the lower decomposition temperature in the atmosphere of the decomposition vessel.

Coatings produced by the instant invention possess low defect density and are useful on electronic devices as protective coatings, as corrosion resistant and abrasion resistant coatings, as temperature and moisture resistant coatings, as dielectric layers, and as a diffusion barrier against ionic impurities such as $Na^+$ and $Cl^-$. The $SiO_2$/metal oxide coatings and the silicon nitrogen-containing ceramic or ceramic-like coatings of the instant invention are also useful as interlevel dielectrics within the body of the electronic device and between the metallization layers, thereby replacing spin-on glass films.

The coatings of the present invention are useful for functional purposes in addition to protection of electronic devices from the environment. The coatings of the present invention are also useful as dielectric layers, doped dielectric layers to produce transistor-like devices, pigment loaded binder systems containing silicon to produce capacitors and capacitor-like devices, multilayer devices, 3-D devices, silicon-on-insulator (SOI) devices, and super lattice devices.

EXAMPLE 1

A preceramic polymer containing hydrogen silsesquioxane resin, $(HSiO_{3/2})_n$, produced by the method of Frye, et al., supra, was diluted in n-heptane and mixed at a 9:1 molar ratio with tetra n-propoxy zirconium, $Zr(OCH_2CH_2CH_3)_4$, to a final solids concentration of 1.0 weight per cent. This preceramic polymer solvent solution was allowed to remain at room temperature for 24 hours. The diluted preceramic polymer solvent solution was then flow coated onto a CMOS electronic device and the solvent allowed to evaporate by drying. By this means was deposited a preceramic polymer coating which was ceramified by heating the coated device in a two inch Lindberg furnace for approximately twenty hours at 200 degrees Centigrade. Additional coatings were also ceramified at 400 degrees Centigrade for one hour. Thin ceramic planarizing coatings of less than 2 microns (or approximately 4000 A) were thus produced on the devices.

EXAMPLE 2

A preceramic polymer mixture containing 90 % hydrogen silsesquioxane resin, $(HSiO_{3/2})_n$, and 10 % tetra isobutoxy titanium, $Ti(OCH_2CH(CH_3)_2)_4$, was prepared in n-heptane at a concentration of 1 weight per cent. The preceramic polymer solution was allowed to stand at room temperature for 24 hours. The dilute preceramic polymer solvent solution was then flow coated onto an electronic device and the solvent allowed to evaporate by drying. By this means was deposited a preceramic polymer coating which was ceramified by heating the coated device for approximately twenty hours at 200 degrees Centigrade or for one hour at 400 degrees Centigrade. Thin ceramic planarizing coatings of less than 2 microns (or approximately 4000 A) were thus produced on the devices.

EXAMPLE 3

A preceramic polymer mixture containing 80 % hydrogen silsesquioxane resin, $(HSiO_{3/2})_n$, 10 % tetra isobutoxy titanium, $Ti(OCH_2C(CH_3)_2)_4$, and 10 % tetra n-propoxy zirconium, $Zr(OCH_2CH_2CH_3)_4$, was prepared at low solids, 1.0 weight per cent, in methyl ethyl ketone. The preceramic polymer solvent solution was allowed to stand at room temperature for 24 hours. The dilute preceramic polymer solvent solution was then flow coated onto an electronic device and the solvent allowed to evaporate by drying. By this means was deposited a preceramic polymer coating which was ceramified by heating the coated device for approximately twenty hours at 200 degrees Centigrade or for one hour at 400 degrees Centigrade. Thin ceramic planarizing coatings of less than 2 microns (or approximately 4000 Angstroms) were thus produced on the devices.

EXAMPLE 4

A preceramic polymer mixture containing 70 % hydrogen silsesquioxane resin, $(HSiO_{3/2})_n$, 10 % tetra isobutoxy titanium, $Ti(OCH_2C(CH_3)_2)_4$, 10 % tetra n-propoxy zirconium, $Zr(OCH_2CH_2CH_3)_4$, and 10 % aluminum pentanedionate, $Al(CH_3COCH_2COCH_3)_3$ was prepared at low solids, 1.0 weight per cent, in methyl ethyl ketone. The preceramic polymer solvent solution was allowed to stand at room temperature for 24 hours. The dilute preceramic polymer solvent solution was then flow coated onto an electronic device and the solvent allowed to evaporate by drying. By this means was deposited a preceramic polymer coating which was ceramified by heating the coated device for approximately twenty hours at 200 degrees Centigrade or for one hour at 400 degrees Centigrade. Thin ceramic planarizing coatings of less than 2 microns (or approximately 4000 Angstroms) were thus produced on the devices.

EXAMPLE 5

A preceramic silazane polymer, prepared by the method of Cannady in Example 1 in U.S. Pat. No. 4,540,803, was diluted to 1.0 weight per cent in toluene. The diluted preceramic silazane polymer solvent solution was then flow coated onto the coated electronic devices of Examples 1 through 4 and the solvent was allowed to evaporate by drying in the absence of air. By this means was deposited a preceramic polymer passivating coating which was ceramified by heating the coated device for approximately one hour at 400 degrees Centigrade under argon. Thin silicon-nitrogen-containing ceramic or ceramic-like passivating coatings of less than 2 microns (or approximately 3000 Angstroms) were thus produced on the devices.

EXAMPLE 6

Using the procedure of Example 5, a preceramic silazane polymer containing about 5 per cent titanium, prepared by the method of Haluska in Example 13 in U.S. Pat. No. 4,482,689, was flow coated onto the SiO$_2$/metal oxide coated electronic device and the solvent allowed to evaporate by drying. By this means was deposited a preceramic polymer coating which was ceramified by heating the coated device for approximately one hour at temperatures up to 400 degrees Centigrade under argon. Thin silicon nitrogen-containing ceramic or ceramic-like passivating coatings of less than 2 microns (or approximately 3000 Angstroms) were thus produced on the devices.

EXAMPLE 7

Using the procedure of Example 5, a preceramic silazane polymer, prepared by the method of Gaul in Example 1 in U.S. Pat. No. Number 4,395,460, was coated onto the SiO$_2$/metal oxide coated electronic device and the solvent allowed to evaporate by drying. By this means was deposited a preceramic polymer coating which was ceramified by heating the coated device for approximately one hour at temperatures up to 400 degrees Centigrade under argon. This silicon nitrogen-containing ceramic or ceramic-like passivating coatings of less than 2 microns (or approximately 3000 Angstroms) were thus produced on the devices.

EXAMPLE 8

A 1-2 weight % solution in diethyl ether of dihydridosilazane polymer, prepared by the method of Seyferth in Example 1 in U.S. Pat. No. 4,397,828, was flow coated onto CMOS devices coated by the methods of Examples 1-4, above. The coated devices were heated in nitrogen for one hour at 400° C. The coating and pyrolysis treatment did not adversely affect the function of the devices, as determined by a CMOS circuit tester. The coated devices withstood 0.1M NaCl exposure for over four and one half hours before circuit failure. A nonprotected CMOS device will fail to function after exposure to a 0.1M NaCl solution for less than one minute.

EXAMPLE 9

The electronic devices coated with the planarizing and/or passivating coatings of Examples 1 through 8 were then overcoated with the barrier coats as follows; Hexafluorodisilane, 500 Torr, was placed in a Pyrex glass reaction container along with a CMOS electronic device, previously coated as above. The hexafluorodisilane was transferred to the glass container in such a manner as to preclude exposure to the atmosphere. The reaction container was then attached to a vacuum line, the contents evacuated, and the container thoroughly heated under vacuum with a gas-oxygen torch. The container was sealed with a natural gas-oxygen torch and heated in an oven for 30 minutes at a temperature of approximately 360 degrees Centigrade. During this time the hexafluorodisilane starting material decomposed and formed a silicon-containing topcoat on the previously coated electronic device. The reaction by-products, mixtures of various halosilanes, and any unreacted starting material were removed by evacuation after the container had been reattached to the vacuum line. The ceramic coated electronic device, onto which the decomposed hexafluorodisilane starting material had deposited a silicon-containing topcoating, was then removed

EXAMPLE 10

Using the procedure described in Example 9, dichlorodisilane was thermally decomposed in the presence of the ceramic or ceramic-like silicon nitrogen-containing coated electronic device. An amorphous silicon-containing topcoat was thereby deposited onto the ceramic or ceramic-like coated electronic device. The coated electronic device was tested and all electronic circuits were operable.

That which is claimed is:

1. A composition of matter comprising a solvent solution of a mixture of hydrogen silsesquioxane resin and a metal oxide precursor selected from the group consisting of an aluminum alkoxide, titanium alkoxide, and zirconium alkoxide.

2. The composition as claimed in claim 1 where the solution contains from 0.1 to 10 percent by weight of the mixture of hydrogen silsesquioxane resin and metal oxide precursor.

3. The composition as claimed in claim 2 where the mixture of hydrogen silsesquioxane resin and metal oxide precursor contains 0.1 to approximately 30 percent by weight, calculated as the metal oxide, of metal oxide precursor.

4. The composition as claimed in claim 3 where the solvent is toluene.

5. The composition as claimed in claim 3 where the solvent is n-heptane.

6. The composition as claimed in claim 3 where the metal oxide precursor is tetra-n-propoxy zirconium.

7. The composition as claimed in claim 3 where the metal oxide precursor is tetra-isobutoxy titanium.

8. The composition as claimed in claim 3 where the metal oxide precursor is aluminum pentanedionate.

9. A composition of matter comprising a methyl ethyl ketone solution of a mixture of hydrogen silsesquioxane resin and a metal oxide precursor selected from the group consisting of an aluminum alkoxide, titanium alkoxide, and zirconium alkoxide.

10. The composition as claimed in claim 9 where the solution contains from 0.1 to 10 percent by weight of the mixture of hydrogen silsesquioxane resin and metal oxide precursor.

11. The composition as claimed in claim 10 where the mixture of hydrogen silsesquioxane resin and metal oxide precursor contains 0.1 to approximately 30 percent by weight, calculated as the metal oxide, of metal oxide precursor.

* * * * *